United States Patent [19]

Gulledge et al.

[11] 4,164,701
[45] Aug. 14, 1979

[54] PORTABLE DEVICE FOR TESTING ELECTRICAL WIRING CIRCUITS AND POWER TOOLS AND EQUIPMENT

[76] Inventors: Charles P. Gulledge, Rte. 9, Box 254, Carrollton, Ga. 30117; Lloyd M. Austin, Rte. 6, Box 374, Carrollton, Ga. 30117; James B. Stephens, 429 N. Main St., Greenville, S.C. 29602

[21] Appl. No.: 830,418

[22] Filed: Sep. 6, 1977

[51] Int. Cl.² ............................................. G01R 31/02
[52] U.S. Cl. .................................... 324/51; 324/73 R
[58] Field of Search ............................... 324/51, 73 R

[56] References Cited

U.S. PATENT DOCUMENTS

| | | | |
|---|---|---|---|
| 2,806,993 | 9/1957 | Matousek | 324/51 |
| 2,840,781 | 6/1958 | Ragonese | 324/51 |
| 2,858,507 | 10/1958 | Liautaud et al. | 324/51 X |
| 3,368,146 | 2/1968 | Regan et al. | 324/51 |
| 3,648,163 | 3/1972 | Pinner et al. | 324/51 |
| 3,728,617 | 4/1973 | Potter | 324/51 |
| 3,753,088 | 8/1973 | Ettelman | 324/51 |
| 3,800,214 | 3/1974 | O'Flynn | 324/51 |
| 3,967,195 | 6/1976 | Averitt et al. | 324/51 |

FOREIGN PATENT DOCUMENTS 807544  1/1959  United Kingdom ............ 324/51

Primary Examiner—Gerard R. Strecker
Attorney, Agent, or Firm—Bailey, Dority & Flint

[57] ABSTRACT

A portable testing device is disclosed for testing the electrical circuits of power tools and cables having a general three-conductor wiring circuit including a first test station for checking the wiring polarity of an outside electrical receptacle from which the testing device operates and a second test station having a testing circuit and receptacle for receiving a plug of the power equipment being tested for detecting the existence of a defective ground circuit in the power equipment. A third test station is provided for checking the ground continuity of a power tool wiring circuit. A fourth test station is provided for checking the wiring conditions of a three-conductor extension power cable having a three-prong plug carried on one end and a three-socket receptacle carried on the other end. The fourth station includes a testing circuit having a three-prong plug for receiving the receptacle end of the power cable while the plug end of the power cable is inserted into a mating receptacle at the second test station. The test circuit includes indicator means for indicating the wire polarity condition of the power extension cable and for testing the cable for the reversal of the ground and neutral conductors therein.

6 Claims, 2 Drawing Figures

PORTABLE DEVICE FOR TESTING ELECTRICAL WIRING CIRCUITS AND POWER TOOLS AND EQUIPMENT

BACKGROUND OF THE INVENTION

The maintenance of power tools and power cables in a proper and safe operating condition is a problem to which considerable attention need be given. In particular, electrically powered tools and cables used at construction sites must be tested for proper wiring conditions periodically so as to comply with governmental safety regulations as well as to insure their proper operating condition. In order to determine the proper and safe operating condition of a power tool or power extension cable, it is necessary to perform a number of individual tests. Due to the large number of tools and cables which may be utilized at a construction site, it is necessary that the individual tests be performed as expediently as possible without sacrificing any quality and reliability in the testing procedures.

Prior devices have been developed for testing the electrical circuits of power tools such as those disclosed in U.S. Pat. Nos. 3,878,458, 3,368,146 and 3,141,128. These devices include various circuit arrangements for testing electrical power tools for a defective ground circuit and for determining whether the frame of the power tool is properly grounded. In addition, U.S. Pat. No. 3,368,146 discloses a test for checking the wiring condition of a three-wire extension cord. However, this test requires that the testing device be unplugged from the AC wall receptacle and the extension connected between the wall receptacle and the testing device. These devices include rather complicated testing circuits and switching circuits to control the various tests being performed which increase the difficulty of operation and adversely affect the reliability of the tests.

SUMMARY OF THE INVENTION

It has been found that a simple yet reliable portable electrical testing device can be provided for testing the electrical wiring circuits in power tools and equipment including a test panel on which a plurality of test stations are arranged in an orderly and expedient fashion. The test device includes a first test station having an indicator means for indicating the wiring polarity of a receptacle at the electrical supply outlet from which the device operates. A second test station is electrically connected to the first test station and has a three-socket receptacle carried on the test panel for receiving a three-prong plug of a cable of a power tool to be tested. The second test station includes a ground fault indicator carried on the test panel which indicates the existence of a defective ground circuit in the power tool. A third test station is electrically connected to the second test station for checking the continuity of the electrical grounding of the case of the power tool of the type which are not double insulated and includes a three-socket receptacle carried on the panel for receiving the power cord plug of the power tool being tested. The fourth test station is provided for testing the proper wiring of a three-wire extension power cable which has a three-prong plug carried on one end and a three-socket receptacle carried on the other end with line, neutral and ground wires connected therebetweeen. The fourth test station includes a testing circuit having a plug carried by the testing panel which includes a line wire prong, a neutral wire prong, and a ground wire prong for receiving the receptacle end of the power cable while the plug end of the power cable is inserted into the receptacle at the second test station. The test circuit includes indicator means electrically connected to prongs of the plug for indicating the wiring polarity conditions of the power extension cable. The test circuit at the fourth test station further includes a test circuit for detecting the reversal of the ground and neutral lines of the power cable.

Accordingly, an important object of the present invention is to provide a reliable testing device for testing the electrical wiring circuits in power tools and equipment which is portable and highly compact affording use in checking tools and equipment at construction sites.

Another important object of the present invention is to provide a testing device for performing a plurality of tests on electrical power tools and equipment which yet is simple in construction and operation enhancing the reliability of the device.

Another important object of the present invention is to provide an electrical testing device for testing the electrical circuits of power tools and equipment wherein all of the testing circuitry is safely carried within a casing and the components of the device for conducting the tests are conveniently accessible on a test panel which is provided with a cover so that the testing circuits are protected from accidental damage.

Yet another important object of the present invention is to provide a testing device for testing the electrical wiring circuits in power tools and power extension cables which accommodates a variety of plug and receptacle arrangements without the necessity of unplugging the device from the electrical supply receptacle.

BRIEF DESCRIPTION OF THE DRAWING

The construction designed to carry out the invention will be hereinafter described together with other features thereof.

The invention will be more readily understood from a reading of the following specification and by reference to the accompanying drawing forming a part thereof, wherein an example of the invention is shown and wherein.

DESCRIPTION OF A PREFERRED EMBODIMENT

Figure 1:
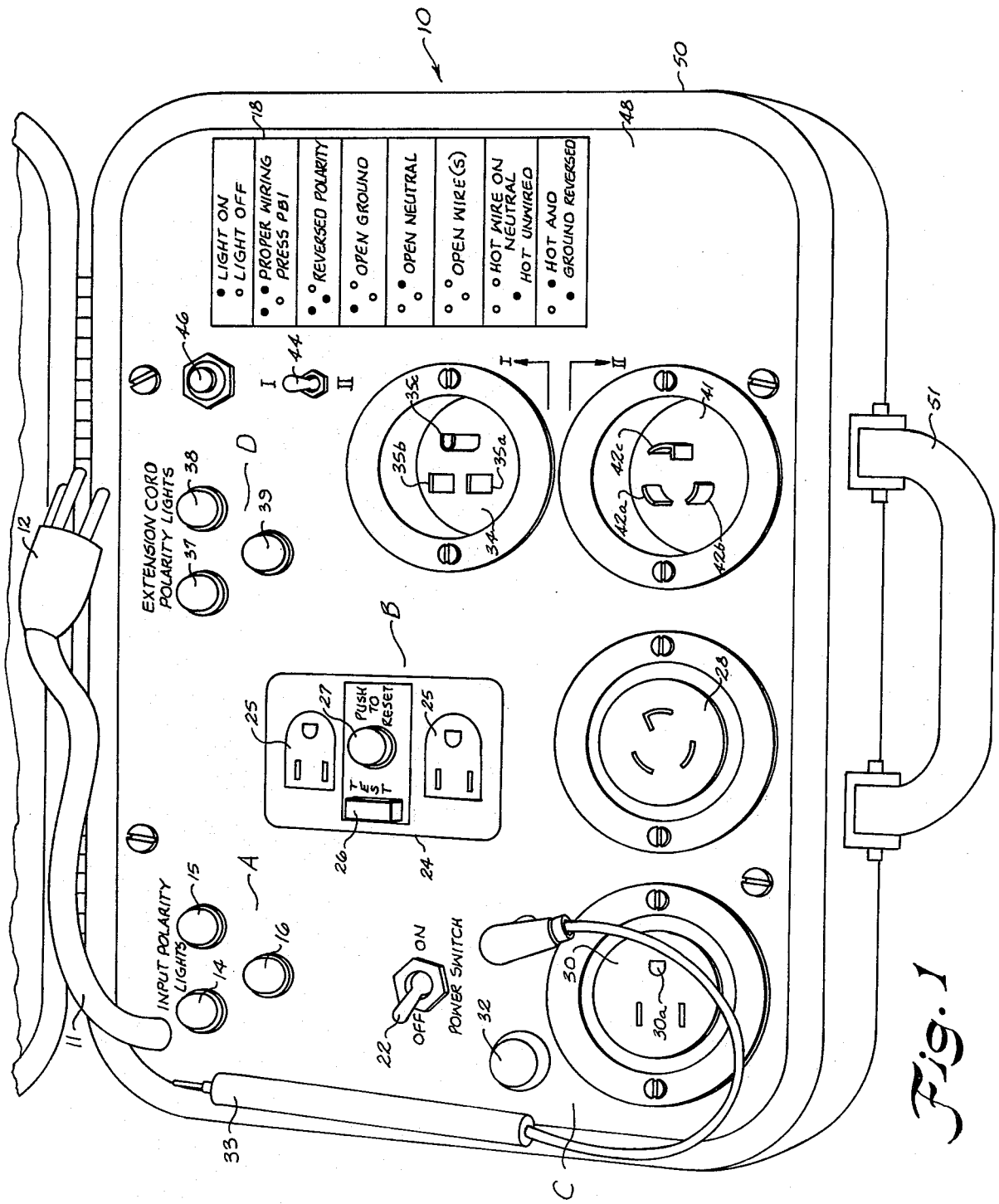
FIG. 1 is a perspective view illustrating a testing device constructed in accordance with the present invention wherein the various testing stations are arranged on a testing panel and enclosed within a portable housing having a cover.
Figure 2:
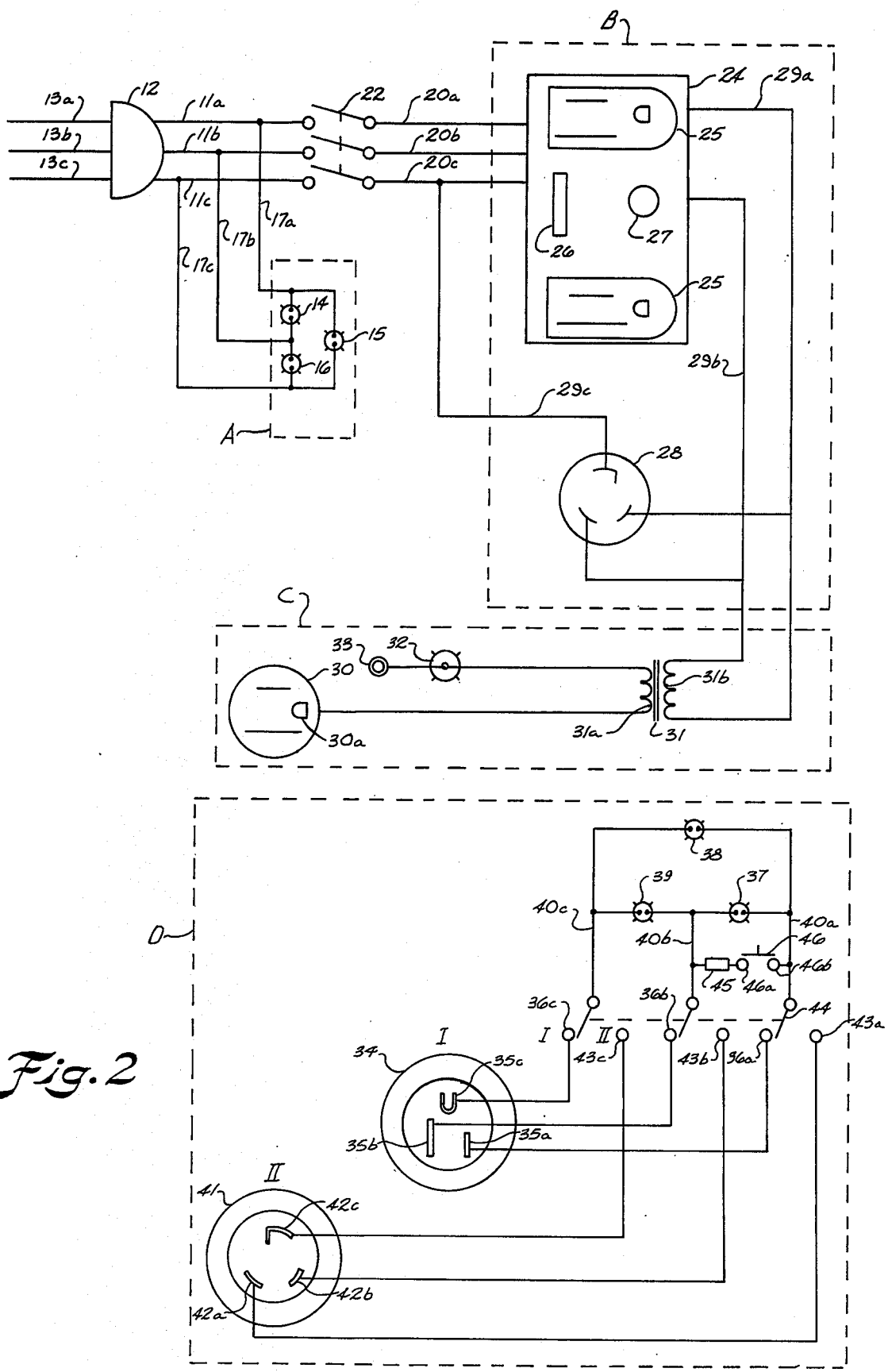
FIG. 2 is a schematic circuit diagram of the testing device constructed in accordance with the present invention.

The invention relates to a portable testing device for performing a plurality of tests on electrical power tools and equipment. Due to safety regulations, which have been adopted to prevent accidents from electrical shock, electrical power tools and equipment must be periodically tested for proper operating conditions. This normally involves going out into the field at construction sites and carrying out tests on the power tools at routine intervals of time. Power tools such as electric drills, saws, and the like as well as power extension cables normally operate from a standard 120 AC outlet which includes a three-socket receptacle having contacts which are supplied electrical power by incoming line voltage, neutral, and ground conductors. The electrically powered tools must have their metal frames grounded for safety and this ground is normally provided by a wire connection from the frame to a ground wire in the electrical circuit of the tool which mates through the plug of the tool to the ground conductor of the electrical outlet receptacle. In the event a short should occur between one of the power carrying conductors of the tool and the frame of the tool, the tool is automatically grounded. In order that the grounding be effected any extension cable through which the tool is operated must be of proper wiring polarity.

Referring now to the drawing, a portable electrical testing device designated generally at 10 is illustrated including a power cord 11 having a three-prong plug 12 connected at the end thereof for mating with a standard three-socket receptacle (not shown) of an outside electrical source which is supplied electrical energy by a standard three-conductor arrangement of a hot or line voltage conductor 13a, a neutral conductor 13b, and a ground conductor 13c.

A first test station A is provided for testing the wiring polarity condition of the outside receptacle into which the prong 12 is inserted. The test station A includes a circuit having a plurality of indicator lights 14, 15 and 16 which are connected to the cord conductors 11a, 11b and 11c which mate with the electrical supply lines 13a, 13b and 13c through the plug 12. One or more of the lamps will be illuminated in response to the wiring condition of the outside receptacle to indicate the polarity thereof according to a predetermined pattern which may be identified and decoded on an information display panel 18.

A second test station B is provided for testing and indicating whether the power tool being tested has a defective circuit such as a ground fault, reversal of neutral and ground conductors, or a short circuit. Test station B is connected to the conductors of power cord 11 by conductors 20a, 20b and 20c through a three-pole electrical switch 22. The test circuit of station B includes a ground fault indicating device 24 having a pair of three-socket receptacles 25 for receiving the plug of the power tool or power extension cable being tested. The ground fault indicating device 24 may be any conventional ground fault indicator which includes a test button 26 and a reset button 27. One suitable ground fault indicator is manufactured by the Leviton Manufacturing Co. of Littleneck, N.Y. as Model No. 6194. Pushing the test button 26 produces a ground fault in the indicating device 24 which causes the reset button 27 to trip and be extended thus exposing a ground fault indicating band which encircles the button 27. This procedure is for testing the correct operation of device 24 which is normally set to trip at a ground fault of five miliamps or more, upon detecting a reversal of neutral and ground conductors, or a short circuit. The reset button 27 may be pushed in to reset the ground fault indicator 24. Station B includes an alternate receptacle 28 which is utilized for testing three-conductor extension cables and power tools having a three-prong plug of alternate configuration in a manner which will be explained more fully hereinafter. Receptacle 28 is connected by conductors 29a, 29b and 29c to the respective conductors 20a through 20c.

A third test station C is provided for testing the ground continuity of the case and wiring circuit of the power tool being tested. As illustrated, the testing circuit includes a three-socket receptacle 30 whose ground socket 30a is connected in series with a low voltage winding 31a of a voltage step-down transformer 31 whose primary winding 31b is connected across the hot conductor 29a and neutral conductor 29b of station B. The remainder of the ground testing circuit includes an indicating lamp 32 and a test jack 33 which is utilized to contact the case of the power tool when the plug of the power tool is inserted in the receptacle 30 whereby a continuous ground circuit in the tool will cause the illumination of lamp 32. The transformer 31 is utilized to step down the line voltage of 120 volts to approximately 6 volts at the secondary winding 31a.

The fourth test station is provided for checking the wiring polarity of a three-wire extension power cable (not shown) which includes a three-prong plug carried on one end and a three-socket receptacle carried on the other end with line, neutral and ground conductors connected therebetween. It is important for the proper and safe operation of any power tool through such an extension cable that the extension be of correct wiring polarity. The station D includes a three-prong plug 34 also denoted by the numeral I. The line conductor prong 35a is connected to a terminal 36a, the neutral conductor prong 35b is connected to a terminal 36b, and the ground conductor prong 35c is connected to a terminal 36c. The plug 34 receives the receptacle end of the power extension cable being tested while the plug end of the power cable being tested is inserted into receptacle 25 at test station B.

A plurality of indicating lamps 37, 38 and 39 are connected to the conductors 40a, 40b and 40c in a manner so as to indicate the wiring conditions of the extension cord in accordance to the display of decoded information on the display panel 18. A second three-prong plug 41, denoted also by the numeral II, is provided for testing power extension cables having plug and receptacle ends of alternate configuration than the plug 34 and receptacle 25. The line voltage prong 42a of plug 41 is connected to a terminal 43a, the neutral prong 42b is connected to the terminal 43b, and the ground prong 42c is connected to a terminal 43c. The prongs 34 and 41 provide for testing of essentially all of the different types of plugs and receptacles normally utilized on extension cables. It will be noted that when plug 41 is used, the plug end of the extension cable being tested will be inserted into the receptacle 28 at station B which mates therewith. A three-pole toggle switch 44 is provided for selecting either plug 34 or 41 by switching between the two sets of terminals 36 and 43. The two positions of the toggle switch 44 are denoted by the numerals I and II.

The testing circuit of station D further includes a second test circuit including an impedance load 45 provided by a conventional resistor, and a pushbutton switch 46 having a pair of terminals 46a and 46b connected in series across the hot and neutral conductors 40a and 40b, respectively. This test circuit checks for the reversal of the ground and neutral lines in the extension cord being tested. An indication of correct wiring polarity may be given by the pattern of illuminated lamps 37 through 39 while the ground and neutral conductors may be reversed in the power extension cable being tested. In order to detect this condition, pushing the button 46 will place the resistive load 45 in circuit between the conductors 40a and 40b. If the ground conductor is reversed with the neutral conductor, a ground fault will be produced in the ground fault indicator 24 causing the reset button 27 to trip. If no trip occurs, proper wiring polarity of the extension cable can be assured.

FIG. 1 illustrates a preferred arrangement of the invention wherein all of the elements thereof to which access must be had in carrying out the testing procedures are carried on a test instrument panel 48. The panel is then secured to a lower half of a carrying case 50 having a carrying handle 51 so that the circuitry of the invention is enclosed beneath the panel 48 and within the lower half of the case 50. In this manner, damage to the circuitry is prevented as well as injury or damage to person or property by coming into contact with the circuitry.

The electrical testing device according to the invention will be summarized by a brief description of the operation of testing procedures. It is to be understood, that the testing device is to be utilized with 120 volt AC outlets. Before making any tests, the AC supply receptacle outlet should be checked for correct polarity. With this test at station A, the switch 22 must be off or in an open position. The plug 12 is inserted into the supply receptacle and the polarity lamps 14 through 16 are observed. In the preferred form, lamps 14 and 15 are green and the lamp 16 is red. An illumination of the two green lights indicates proper wiring of the receptacle. If the receptacle into which the testing device is plugged has the proper wiring polarity, the power tool may then be tested at station B for a defective ground wiring. After closing switch 22, it may be desirable to depress test button 26 to assure that the ground fault indicator 24 trips at the desired level which is normally five miliamps. Once the proper operating condition of the ground fault indicator 24 is ascertained the power tool may be plugged in 25 or 28 and turned on for about a 10 second interval. If a defective circuit exists in the power tool such as a ground fault, a reversal of neutral and ground conductors, or a short circuit, the reset button 27 will trip exposing the fualt indicator band thereon. If no ground fault is indicated, the power tool may be unplugged from station B and inserted into receptacle 30 for testing of the continuity of the grounding of the tool case. If the lamp 32 is illuminated when the case of the power tool is contacted with the probe 33, a continuous ground circuit is indicated in the tool. To check extension power cables being utilized, the receptacle end of the power cable is mated with either plug 34 or 41 depending on the type being utilized while the plug end of the extension is inserted into the corresponding receptacle 25 or 28. With toggle switch 44 set in the proper position, the illumination of polarity lamps 37 through 39 will be noted. If the green lamps light up, the wiring polarity of the extension cable should be correct. However, to assure that the ground and neutral lines of the extension cable are not reversed, the test button 46 should be depressed. If the ground fault indicating button 27 trips, the ground and neutral line conductors of the extension cable are reversed and the cable fails its test. However, if no trip occurs at the ground fault indicator 24, correct wiring polarity of the extension cable is assured.

Thus, it can be seen that an advantageous construction for a testing device can be had according to the invention which can perform a plurality of tests on power tools and equipment in order to insure their proper and safe operating condition. A highly reliable and compact construction is afforded which may be conveniently carried on construction sites to check the power tools and equipment for compliance with governmental safety regulations. The device affords testing of all tools and equipment by one device from a standard receptacle outlet which is first determined to be in proper wiring condition. Thus, all of the tests which are subsequently carried out by the device can be assured to be reliable. The testing procedure is simple and testing can be carried out in a relatively short period of time affording checking of a large number of tools.

While a preferred embodiment of the invention has been described using specific terms, such description is for illustrative purposes only, and it is to be understood that changes and variations may be made without departing from the spirit or scope of the following claims.

What is claimed is:

1. A portable electrical testing device for testing electrical wiring circuits in power tools and equipment which operate from an outside electrical source supplied by a line, neutral, and ground conductor wire, said device comprising:

a three-conductor wire power cord having a three-prong plug for connecting said device to a three-socket receptacle of said outside electrical source;

a first test station having indicator means electrically connected to the conductors of said power cord for indicating the wiring polarity condition of said outside receptacle;

a second testing station electrically connected to said first station having a three-socket receptacle for receiving a three-prong plug of a cable of the power tool and equipment being tested;

said second station including a ground fault device having a test circuit connected to said receptacle which includes a fault indicator for indicating the existence of a defective circuit in said power tool and equipment;

a third test station having a three-socket receptacle for receiving said plug of said power tool being tested, said third test station including circuit means connected to said third station receptacle for indicating the continuity of a ground circuit in said power tool;

a fourth test station for testing the proper wiring of a three-wire extension power cable having a three-prong plug carried on one end and a three-socket receptacle carried on the other end thereof with line, neutral, and ground conductors connected therebetween;

said fourth station including a testing circuit having a plug which includes a line wire prong, neutral wire prong, and a ground wire prong for receiving said power cable receptacle while said power cable plug is inserted into the receptacle of said second test station, said extension power cable being connected between said fourth and second stations during testing assuring proper line polarity and facilitating detecting of the reversal of conductors of said extension power cable, said test circuit including indicator means electrically connected to said prongs of said plug of said fourth station for indicating the wiring polarity condition of said power extension cable and said fourth test station including a second testing circuit for detecting reversal of the neutral and ground conductors in said power cable which includes an impedance load and switch means connected across said neutral and ground prongs, closure of said switch means producing a fault sufficient to cause said fault indicator to trip when said neutral and ground conductors are reversed.

2. The device set forth in claim 1 wherein said fourth station includes at least two types of three-prong plugs for accommodation of different types of extension cable receptacles and switch means for selectively connecting a desired plug to said testing circuit.

3. The device set forth in claim 2 wherein said second station further includes at least two types of three-prong receptacles for the reception and mating of the opposing ends of said extension cable according to the selection of plugs at said fourth station.

4. The device as set forth in claim 1 wherein said indicator means includes a plurality of indicator lamps and an information display for decoding the illumination pattern of said lights into an indication of the polarity of the receptacle and wiring being tested.

5. The device set forth in claim 1 including a voltage step-down transformer having a primary winding electrically connected to said second station;
   said third station including a test circuit which includes a secondary winding of said step-down transformer in series with said receptacle of said third station;
   an indicator light; and
   a conductive test jack for contacting the outer metal casing of the power tool being tested for determining the continuity of the ground circuit herein.

6. The device set forth in claim 1 including switch means connected between said first and second stations for selectively opening and closing the connection therebetween.

* * * * *